(12) United States Patent
Freimann et al.

(10) Patent No.: US 12,346,033 B2
(45) Date of Patent: *Jul. 1, 2025

(54) OPTICAL SYSTEM

(71) Applicant: Carl Zeiss SMT GmbH, Oberkochen (DE)

(72) Inventors: Rolf Freimann, Aalen (DE); Juergen Baier, Oberkochen (DE); Steffen Fritzsche, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

This patent is subject to a terminal disclaimer.

(21) Appl. No.: 17/718,868

(22) Filed: Apr. 12, 2022

(65) Prior Publication Data
US 2022/0236652 A1    Jul. 28, 2022

Related U.S. Application Data

(60) Continuation of application No. 16/510,055, filed on Jul. 12, 2019, now abandoned, which is a division of
(Continued)

(30) Foreign Application Priority Data

Jun. 18, 2015    (DE) .................... 102015211286.1

(51) Int. Cl.
*G03F 7/00*      (2006.01)
*G02B 7/182*     (2021.01)

(52) U.S. Cl.
CPC ....... *G03F 7/70825* (2013.01); *G02B 7/1828* (2013.01); *G03F 7/70241* (2013.01);
(Continued)

(58) Field of Classification Search
CPC .... G03F 7/70825; G03F 7/7085; G03F 7/709; G03F 7/70975; G03F 7/702; G03F 7/70141

See application file for complete search history.

(56) References Cited

U.S. PATENT DOCUMENTS

| H2114 H | 2/2005 | Novak et al. |
| 7,151,588 B2 | 12/2006 | Franken |

(Continued)

FOREIGN PATENT DOCUMENTS

| CN | 1591195 A | 3/2005 |
| CN | 102648402 A | 8/2012 |

(Continued)

OTHER PUBLICATIONS

Translation of International Search Report for corresponding Appl No. PCT/EP2016/064086, dated Sep. 26, 2016.
(Continued)

*Primary Examiner* — Steven H Whitesell
(74) *Attorney, Agent, or Firm* — Fish & Richardson P.C.

(57) ABSTRACT

The disclosure provides an optical system, having a first optical control loop, which is set up to regulate a position and/or spatial orientation of a first optical element relative to a first module sensor frame, and a first module control loop, which is set up to regulate a position and/or spatial orientation of the first module sensor frame relative to a base sensor frame. Related components and methods are also provided.

21 Claims, 10 Drawing Sheets

Related U.S. Application Data application No. 15/835,922, filed on Dec. 8, 2017, now Pat. No. 10,386,733, which is a continuation of application No. PCT/EP2016/064086, filed on Jun. 17, 2016.

(52) U.S. Cl.
CPC ...... *G03F 7/70258* (2013.01); *G03F 7/70275* (2013.01); *G03F 7/70316* (2013.01); *G03F 7/70833* (2013.01); *G03F 7/70* (2013.01)

(56) References Cited

U.S. PATENT DOCUMENTS

| | | | |
|---|---|---|---|
| 7,817,248 | B2 | 10/2010 | Kwan |
| 2003/0010902 | A1 | 1/2003 | Hof et al. |
| 2003/0168615 | A1* | 9/2003 | Loopstra ............. G03F 7/70258 250/492.1 |
| 2005/0083500 | A1* | 4/2005 | Franken ............. G03F 7/70825 355/53 |
| 2005/0105070 | A1* | 5/2005 | Bartray ................. G03F 7/709 355/75 |
| 2005/0140950 | A1 | 6/2005 | Franken |
| 2009/0050776 | A1 | 2/2009 | Muehlbeyer et al. |
| 2010/0026976 | A1 | 2/2010 | Meehan et al. |
| 2011/0299053 | A1* | 12/2011 | Steinbach ........... G03F 7/70825 355/67 |
| 2012/0105819 | A1 | 5/2012 | Butler |
| 2012/0140241 | A1 | 5/2012 | Hof et al. |
| 2012/0154774 | A1 | 6/2012 | Van Der Wijst |
| 2012/0242969 | A1* | 9/2012 | Van Der Pasch ....... G03F 7/709 355/72 |
| 2013/0343422 | A1 | 12/2013 | Laufer |
| 2014/0022527 | A1 | 1/2014 | Van Der Pasch et al. |
| 2014/0185029 | A1 | 7/2014 | Kwan |
| 2014/0346909 | A1 | 11/2014 | Volger et al. |
| 2015/0212431 | A1 | 7/2015 | Mueller et al. |
| 2018/0017879 | A1* | 1/2018 | Butler ................. G03F 7/70725 |
| 2018/0101105 | A1 | 4/2018 | Freimann et al. |
| 2019/0354025 | A1 | 11/2019 | Freimann et al. |
| 2020/0209757 | A1* | 7/2020 | Butler ................. G03F 7/70758 |

FOREIGN PATENT DOCUMENTS

| | | |
|---|---|---|
| DE | 602004009256 T2 | 7/2008 |
| DE | 102008004762 | 7/2009 |
| DE | 102011005885 A1 | 9/2012 |
| DE | 102012202553 | 8/2013 |
| EP | 1 513 021 A1 | 3/2005 |
| KR | 2015-0048244 A | 5/2015 |
| WO | WO 2015/043682 A1 | 4/2015 |

OTHER PUBLICATIONS

Chinese Office Action, with translation thereof, for corresponding App No. 201680035728.5, dated Jan. 6, 2020.
Chinese Office Action, with translation thereof, for corresponding Appl No. 201680035728.5, Sep. 25, 2020.
Chinese Office Action, with translation thereof, for corresponding Appl No. 201680035728.5, dated Apr. 23, 2021.
Korean Office Action, with translation thereof, for corresponding Appl No. 10-2018-7001527, dated Sep. 7, 2023.
Bertoline et al., Fundamentals of Graphics Communication, 1998, pp. 325 and 328.
Korean Office Action, with translation thereof, for corresponding Appl No. 10-2018-7001527, dated Apr. 16, 2024.
Korean Notice of Allowance, with translation thereof, for corresponding KR Appl No. 10-2018-7001527, dated Sep. 30, 2024.

* cited by examiner

OPTICAL SYSTEM

CROSS-REFERENCE TO RELATED APPLICATIONS

The present application is a continuation of, and claims benefit under 35 USC 120 to, U.S. application Ser. No. 16/510,055, filed Jul. 12, 2019, which is a division of, and claims benefit under 35 USC 120 to, U.S. application Ser. No. 15/835,922, filed Dec. 8, 2017, now U.S. Pat. No. 10,386,733, which is a continuation of, and claims benefit under USC 120, to international application PCT/EP2016/064086, filed Jun. 17, 2016, which claims benefit under 35 USC 119 of German Application No. 10 2015 211 286.1, filed Jun. 18, 2015. The entire disclosure of these applications are incorporated by reference herein.

FIELD

The disclosure relates to an optical system, a photomask inspection system, a projection system, a lithography apparatus and to a method for regulating an optical system.

BACKGROUND

Microlithography is used for producing microstructured components, for example integrated circuits. The microlithography process is carried out in what is called a projection exposure apparatus, which includes an illumination device and a projection lens. The image of a photomask (reticle) illuminated by way of the illumination device is in this case projected by way of the projection lens onto a wafer coated with a light-sensitive layer (photoresist) and arranged in the image plane of the projection lens, in order to transfer the structure of the photomask onto the light-sensitive coating of the substrate.

Mirrors of the projection lens are typically retained in a holding frame (force frame). The mirrors are positioned (in up to three translational degrees of freedom) and spatially oriented (in up to three rotational degrees of freedom) relative to a sensor frame. The sensor frame is configured as a stable frame surrounding the holding frame. Via openings in the holding frame, sensor heads of the sensor frame can be brought closely enough to the mirrors to perform precise measurements with respect to the position and the spatial orientation of the mirrors. One or more mirrors can deteriorate in terms of reflection over the course of their operation and must be interchanged. The sensor frame can here impede the interchanging of deteriorated mirrors.

US 2012/0140241 A1 discloses an approach for mounting the mirrors without a physically stable frame. In this case, six optical longitudinal measurement sections between in each case two neighboring mirrors are described, with which the positions and spatial orientations of the mirrors with respect to one another can be determined. For the longitudinal measurement sections, numerous free visual axes are involved, which are not always available in EUV projection lenses.

U.S. Pat. No. 7,817,248 B2 discloses an optical system, in which optical elements are directly positioned relative to one another using reference elements or indirectly via the holding frame to which the optical elements are attached. The reference elements are here connected to the optical elements.

SUMMARY

The disclosure seeks to provide an improved optical system. In particular, the interchanging of individual mirrors is to be facilitated.

In one aspect, the disclosure provides an optical system, having a first optical control loop, which is set up to regulate a position and/or spatial orientation of a first optical element relative to a first module sensor frame, and a first module control loop, which is set up to regulate a position and/or spatial orientation of the first module sensor frame relative to a base sensor frame.

The optical system preferably additionally has a second optical control loop, which is set up to regulate a position and/or spatial orientation of a second optical element relative to a second module sensor frame, and a second module control loop, which is set up to regulate a position and/or spatial orientation of the second module sensor frame relative to the base sensor frame.

The position and/or spatial orientation of the first optical element can advantageously be regulated independently of the second optical element. In other words, they do not need to have visual contact with one another in order to be positioned and spatially oriented in each case. The common reference is here the base sensor frame.

The optical control loops and the module control loop can have different control accuracy. For example, the module control loop can provide coarse positioning, while the optical control loops serve for fine positioning. For example, for adjusting the first and second optical elements for a lithography process, first, the coarse adjustment of the first and second optical elements or of the corresponding modules containing them can be performed using the module control loop. In a further step, the fine adjustment of the optical elements is then performed using the optical control loops.

Provision may furthermore be made for the first and second optical elements to be positioned and/or spatially oriented within the respective module thereof, and for installation of the corresponding modules in the optical system to be performed only afterward.

It is to be understood that the first and second module sensor frames and the base sensor frame are different, i.e. spatially separate, frames.

Of course, more than two, such as six or more optical elements, plus the associated sensor modules, can be provided.

The first and second optical elements are preferably arranged in the beam path of the optical system, in particular in the beam path of the working light (i.e. the light used to expose the substrate, in particular a wafer). They can follow one another directly in the beam path, or further optical elements can be arranged in the beam path between them.

The first and/or second optical element can be a mirror, a lens element, an optical grating or a waveplate.

"Frame" in the present case does not necessarily presuppose a frame-shaped structure, but rather also encompasses for example a platform or a plate.

The first and/or second module sensor frame and/or the base sensor frame are configured to be rigid, in particular partially or completely from one or more of the following materials: silicon carbide (SiC), reaction-bonded silicon-infiltrated silicon carbide (SiSiC), cordierite, aluminum oxide ($Al_2O_3$), aluminum nitride (AlN).

"Positioning" in the present context means a movement of the corresponding optical element in up to three translational degrees of freedom. "Spatially orienting" in the present context means a movement of the corresponding optical element in up to three rotational degrees of freedom.

In accordance with one embodiment, provision is made for the first optical control loop to have a first sensor for capturing the position and/or spatial orientation of the first optical element relative to the first module sensor frame, and a first actuator for positioning and/or spatially orienting the first optical element in dependence on the captured position and/or spatial orientation of the first optical element, and/or for the second optical control loop to have a second sensor for capturing the position and/or spatial orientation of the second optical element relative to the second module sensor frame, and a second actuator for positioning and/or spatially orienting the second optical element in dependence on the captured position and/or spatial orientation of the second optical element.

The first and/or second sensor preferably capture the position and/or spatial orientation of the corresponding optical element in up to six degrees of freedom. In particular, the position and/or spatial orientation is/are captured in contact-free fashion, for example using optical sensors, in particular grating sensors, or capacitive sensors. Optical capturing can be performed in the form of photoelectric scanning in accordance with the interferential measurement principle with single-field scanning. The resolution of preferred sensors is below 100 pm, preferably below 50 pm.

The first and/or second sensor can be made up of a transmitting/receiving unit and a measurement object (target), which reflects electromagnetic light that is emitted by the transmitting/receiving unit back to the transmitting/receiving unit for reception. A measurement section is defined between the transmitting/receiving unit and the measurement object. The distance can be, for example, less than 8, preferably less than 4 and with further preference less than 1 mm.

In particular, the first and/or second actuator are in the form of Lorentz, reluctance or piezoactuator or a stepper motor.

In accordance with a further embodiment, provision is made for the first module control loop to have a third sensor for capturing the position and/or spatial orientation of the first module sensor frame relative to the base sensor frame, and a third actuator for positioning and/or spatially orienting the first module sensor frame in dependence on the captured position and/or spatial orientation of the first module sensor frame, and/or for the second module control loop to have a fourth sensor for capturing the position and/or spatial orientation of the second module sensor frame relative to the base sensor frame, and a fourth actuator for positioning and/or spatially orienting the second module sensor frame in dependence on the captured position and/or spatial orientation of the second module sensor frame.

What was stated in relation to the first and second sensors and to the first and second actuators applies to the third and fourth sensors and the third and fourth actuators.

In accordance with a further embodiment, provision is made for the first module control loop and the first optical control loop and/or the second module control loop and the second optical control loop to be set up to interact with one another such that the position and orientation of the first and second optical elements are able to be regulated in each case in all six degrees of freedom relative to the base sensor frame.

In accordance with a further embodiment, the first actuator is supported on a first module holding frame and the second actuator is supported on a second module holding frame.

The first module sensor frame can be supported on the first module holding frame and the second module sensor frame can be supported on the second module holding frame, in particular in an oscillation-decoupled manner. They can be supported here via one or more connecting elements, which are for example soft (low spring stiffness).

In accordance with a further embodiment, the third actuator supports the first module holding frame on a base holding frame, and the fourth actuator supports the second module holding frame on the base holding frame.

The base sensor frame is preferably mechanically decoupled from the base holding frame. This means in particular that transfer of oscillations from the base holding frame to the base sensor frame—for example using suitable dampeners—is avoided. In particular, the base sensor frame and the base holding frame are connected to one another using an interface element. The interface element can exhibit oscillation decoupling.

In particular, the base holding frame encloses a volume in which the base sensor frame is partly or completely arranged. In this case, the base sensor frame can also be referred to as a central sensor frame. As a result, improved access to the optical elements, in particular for the purposes of interchanging them, for example in the case of reflection deterioration, is possible. In particular, it is possible in this way to simply install and/or interchange the modules having the first and second mirrors. The base sensor frame can have a plurality of arms projecting from a base body, wherein at least two of the arms have a third sensor. The base body and the projecting arms can be configured in one part or one piece. "One part" means that the corresponding elements are connected to form a fixedly connected unit by way of a fastening mechanism, such as screws. "One piece" means that the corresponding elements are made of the same piece of material.

Provided in accordance with a further embodiment are a first module having the first optical element, the first module sensor frame, the first sensor, the first module holding frame and the first actuator, and/or a second module having the second optical element, the second module sensor frame, the second sensor, the second module holding frame and the second actuator, with the first and/or second module being arranged between the base sensor frame and the base holding frame.

The first and second modules can be pre-assembled, for example, and then installed in the optical system, i.e. inserted between the base sensor frame and the base holding frame.

Provided in accordance with a further embodiment is a device for capturing a change in position, a change in spatial orientation and/or a deformation of the base sensor frame or parts thereof and/or of the module sensor frame with respect to a reference outside the base holding frame.

In accordance with a further embodiment, the device has an interferometer, in particular a phase-shifting interferometer or a moiré interferometer.

In accordance with a further embodiment, the interferometer has a measurement section, along which electromagnetic radiation is sent and which extends via two reflection points on the base sensor frame and/or on the module sensor frames.

In one aspect, the disclosure provides an optical system, having optical elements, actuators, a holding frame on which the optical elements are held in a way in which they are able to be positioned and/or spatially oriented using the actuators, a sensor frame which is mechanically decoupled from the holding frame, and sensors which are set up to capture a position and/or spatial orientation of a respective optical element relative to the sensor frame, wherein the holding frame encloses a volume and the sensor frame is arranged partially or entirely within the volume.

The features, definitions and further developments, previously described in connection with the modular approach, correspondingly apply, unless expressly stated otherwise. The same also applies the other way around.

Due to the fact that the holding frame encloses a volume and the sensor frame is arranged partially or entirely within the volume, good access to the optical elements is provided, for example for the purpose of interchanging them, without the access being blocked by the holding frame.

The sensor frame is mechanically decoupled from the holding frame so as to avoid in particular transfer of oscillations from the holding frame to the sensor frame—for example using suitable dampeners. Alternatively, mechanical decoupling could also be dispensed with in other embodiments.

In accordance with one embodiment, provision is made for the sensor frame to have a plurality of arms projecting from a base body, wherein at least two of the arms carry in each case one of the sensors.

The resulting arm structure, which can also be referred to as a scaffold structure, tree structure or star structure, allows for the corresponding measurement sections (in the present case also referred to as the "measurement distance") for the sensors to be made small, which increases the measurement accuracy. What was the in relation to the modular embodiment applies correspondingly with respect to the sensors.

In accordance with a further embodiment, provision is made for the base body and the arms projecting therefrom to be configured in one part or in one piece.

Provided in accordance with a further embodiment is a device for capturing a change in position, a change in spatial orientation and/or a deformation of the sensor frame or parts thereof with respect to a reference outside the holding frame.

In accordance with a further embodiment, the device has an interferometer, in particular a phase-shifting interferometer or a moiré interferometer.

In accordance with a further embodiment, the interferometer has a measurement section, along which electromagnetic radiation is sent and which extends via two reflection points on the sensor frame.

Furthermore provided is a photomask inspection system for inspecting a photomask using an optical system, as described above.

Furthermore, a projection system for a lithography apparatus including an optical system, as described above, is provided.

Furthermore, a lithography apparatus including an optical system, as described above, or including a projection system, as described above, is provided.

In on aspect, the disclosure provides a method for regulating an optical system, wherein a position and/or spatial orientation of a first optical element relative to a first module sensor frame is regulated in a first optical control loop, and a position and/or spatial orientation of the first module sensor frame relative to a base sensor frame is regulated in a first module control loop.

Furthermore provided in accordance with the method is preferably that a position and/or spatial orientation of a second optical element relative to a second module sensor frame is regulated in a second optical control loop, and a position and/or spatial orientation of the second module sensor frame relative to the base sensor frame is regulated in a second module control loop.

The features and embodiments described with respect to the optical system apply accordingly to the photomask inspection system, the projection system, the lithography apparatus and the method for regulating an optical system, and the other way around.

If in the present case mention is made of "an" element, for example an optical element or an actuator, this does not at all preclude that a plurality of corresponding elements are provided, for example 2, 3, 4 or more.

Further aspects of an optical system, of a photomask inspection system, of a projection system, of a lithography apparatus, of a method for installing and/or interchanging optical elements of an optical system will be stated below. One or more of the aspects can be provided alone or be combined with the optical system, the photomask inspection system, the projection system, the lithography apparatus or the method for regulating an optical system, as in each case described above.

In one aspect, the disclosure provides an optical system, which carries a plurality of optical elements, a holding frame which carries the plurality of optical elements, a plurality of first sensors which are set up to capture a position and/or a spatial orientation of the optical elements, and a sensor frame which carries the plurality of first sensors. The sensor frame is arranged at least partially within the holding frame.

Due to the fact that the sensor frame is arranged at least partially within the holding frame, an optical element of the optical system can be interchanged relatively easily. This advantage is achieved because no closed sensor frame is present anymore which surrounds the holding frame and impedes the introduction of an optical element into the optical system or removal of an optical element from the optical system. The sensor frame which is arranged at least partially within the holding frame can furthermore be guided into the vicinity of each optical element, with the result that the optical elements can be positioned and spatially oriented on the basis of the sensor frame.

"Partially arranged within the holding frame" means that the holding frame defines an enveloping surface, in particular an at least partially cylindrical enveloping surface, into which the sensor frame projects.

The optical system has a plurality of optical elements, the position and/or spatial orientation of which is determined by way of the sensor frame and the first sensors. The optical system can have in particular two, three, four, five, six, seven, eight, nine, ten, eleven or twelve of such optical elements.

The optical system can be embodied in the form of an imaging system.

A projection system of a lithography apparatus can have such an optical system. The corresponding optical elements are then arranged in the projection system of the lithography apparatus. The projection system of the lithography apparatus furthermore can have further optical elements, the position and/or spatial orientation of which is determined by way of the sensor frame and the first sensors.

In one embodiment, the first sensor has a transmitting and receiving unit and a corresponding unit that sends a signal back to the transmitting and receiving unit. The transmitting and receiving unit of the first sensor is preferably attached to the sensor frame. In this case, the unit that sends the signal back to the transmitting and receiving unit is arranged at the optical element or at a module having the optical element. Alternatively, the unit that sends the signal back to the transmitting and receiving unit can also be attached to the sensor frame. The transmitting and receiving unit of the first sensor is then attached to the optical element or to a module having the optical element. At least part of the first sensor is accordingly attached to the sensor frame.

In accordance with one embodiment of the optical system, the sensor frame has a plurality of arms. As a result, a first sensor, which is attached to one of the arms of the sensor frame, can be arranged in the vicinity of one of the optical elements. In particular, a first sensor can be arranged at the end of an arm. This permits reliable measurement of the position and/or spatial orientation of the corresponding optical element. Furthermore, a sensor frame having a plurality of arms is more compact and lightweight than a voluminous sensor frame. Due to the construction, it is thus possible to save weight with a sensor frame having a plurality of arms. In addition, the sensor frame can be arranged between the optical elements. The sensor frame therefore no longer surrounds the optical elements. Consequently, the optical elements can be installed and removed more easily.

In accordance with a further embodiment of the optical system, the sensor frame is configured in the form of a scaffold or a star. Advantageously it is possible, due to the scaffold construction or the star construction, to save weight as compared to a voluminous sensor frame. In addition, the sensor frame no longer surrounds the optical elements, but is arranged between them. Consequently, the optical elements can be installed and removed more easily.

In accordance with a further embodiment of the optical system, a measurement distance between one of the first sensors of the sensor frame and one of the optical elements is less than 8 mm, preferably less than 4 mm, and with further preference less than 1 mm. The measurement distance is the distance between the transmitting and receiving unit of the first sensor and the unit of the first sensor that sends a signal back to the transmitting and receiving unit. Attaching a first sensor, preferably the transmitting and receiving unit of the first sensor, to the sensor frame in the vicinity of the optical element advantageously permits very accurate measurement of the position and/or of the spatial orientation of the optical element. It is possible here to use grating sensors for the measurement. Alternatively, the use of sensors having a greater working distance would simplify the installation process.

In accordance with a further embodiment of the optical system, the sensor frame is attached to the holding frame. The holding frame is advantageously a stable, non-deformable component. The sensor frame can therefore be suitably attached to the holding frame.

In accordance with a further embodiment of the optical system, the latter furthermore has an interface ring, wherein the holding frame and/or the sensor frame are attached to the interface ring. The interface ring is a stable, non-deformable component, to which a plurality of components can be attached. The interface ring advantageously gives the optical system a stable construction.

In accordance with a further embodiment of the optical system, the sensor frame is configured to be rigid. "Configured to be rigid" here means that the sensor frame cannot be easily deformed. In this case, the sensor frame can include one or more of the following materials: silicon carbide (SiC), reaction-bonded silicon-infiltrated silicon carbide (SiSiC), cordierite, aluminum oxide ($Al_2O_3$), aluminum nitride (AlN).

In accordance with a further embodiment of the optical system, the sensor frame is positionable in relation to a reference outside the holding frame. The position and/or spatial orientation of the sensor frame in relation to a reference can advantageously be readjusted. Exact positioning and/or spatial orientation of the sensor frame is important because the sensor frame for its part likewise serves as a reference for the optical elements.

In accordance with a further embodiment of the optical system, the latter furthermore has one or more interferometers for measuring a longitudinal change, for measuring a position change and/or for measuring an angular change. Since the sensor frame is used as a reference for positioning and/or spatially orienting the optical elements, a deformation of the sensor frame also falsifies the positioning and/or the spatial orientation of the optical elements. For this reason, the deformation of the sensor frame can be measured with one or more interferometers. The deformation of the sensor frame can then be taken into account during the positioning and/or spatially orientation. In the case of a module which has an optical element, a modular sensor frame and a modular holding frame, it is furthermore possible to measure the position and/or angular change of the modular sensor frame relative to the modular holding frame.

In accordance with a further embodiment of the optical system, the one or more interferometers are in the form of phase-shifting interferometers and/or length measurement interferometers. Various interferometers can be advantageously used.

In accordance with a further embodiment of the optical system, the one or more interferometers are set up to apply moiré measurement techniques. Tilting or twisting of the sensor frame can advantageously be measured in this way.

In accordance with a further embodiment of the optical system, the one or more interferometers have a branched arrangement of moiré measurement sections. It is thus advantageously possible to measure changes in the entire sensor frame, even if the sensor frame has branches.

In accordance with a further embodiment of the optical system, the latter furthermore has a first control loop for each optical element, wherein the respective first control loop includes one or more first actuators and one or more of the first sensors in order to position the respective optical elements relative to the sensor frame. The first control loop can be used to position and/or spatially orient the optical elements relative to the sensor frame.

In accordance with a further embodiment of the optical system, the respective optical element is connected to the holding frame via the one first actuator or the plurality of first actuators. The optical elements are advantageously carried by the holding frame.

In accordance with a further embodiment of the optical system, the latter furthermore has at least one module, wherein the at least one module includes one of the optical elements, a modular sensor frame and/or a modular holding frame, and wherein the at least one module is interchangeable. The optical element can additionally be adjusted relative to the modular sensor frame. The modular sensor frame can be adjusted relative to the sensor frame. The optical element can furthermore be connected to the holding frame by the modular holding frame.

In accordance with a further embodiment of the optical system, the latter furthermore has a second control loop for the optical element of the at least one module, wherein the second control loop includes one or more second actuators and one or more second sensors in order to position the optical element relative to the modular sensor frame. The optical element can advantageously be adjusted relative to the modular sensor frame using the second control loop. Overall, an optical element is always able to be positioned and spatially oriented in six degrees of freedom, i.e. in three spatial directions and at three angles. This ability to be positioned and spatially oriented is always the case in sum with the first and second control loops. If one of the two control loops can already position and spatially orient the optical element in six degrees of freedom, it is possible for the other control loop to be able to position and spatially orient the optical element only in fewer than six degrees of freedom.

By way of example, the first control loop can increase the actuation range of the mirror and thus ideally complement the second control loop, which is highly precise but in turn limited in the actuation range.

In accordance with a further embodiment of the optical system, the optical element is connected to the modular holding frame via the one second actuator or the plurality of second actuators. The optical element is advantageously carried by the modular holding frame.

In principle, the first actuators and the second actuators can be in the form of Lorentz actuators, piezoactuators or actuators having stepper motors.

In accordance with a further embodiment of the optical system, the modular holding frame is connected to the holding frame. Accordingly, the optical element is connected directly to the modular holding frame via the second actuators. The optical element is furthermore indirectly connected to the holding frame via the modular holding frame and the first actuators, which are attached both to the modular holding frame and to the holding frame.

In accordance with a further embodiment of the optical system, one or more of the first and/or one or a plurality of the second sensors are configured in the form of optical sensors. Optical sensors are advantageously highly suitable for vacuum environments.

In accordance with a further embodiment of the optical system, the sensor frame defines a coordinate system and the respective optical element is positionable in three spatial directions and three angles relative to the coordinate system using the first and/or second control loop. "Defining" means that the sensor frame acts as a reference point for the coordinate system. The optical element is always capable of being positioned and spatially oriented in six degrees of freedom. This ability to be positioned and spatially oriented can be achieved by way of the first and/or second control loop. The ability to be positioned and spatially oriented in six degrees of freedom, i.e. the ability to be positioned and spatially oriented in three spatial directions and at three angles, is always achieved in the sum of the first and second control loops.

In accordance with a further embodiment of the optical system, the respective optical element has a mirror or a lens element. The optical element can be configured both in the form of a mirror and in the form of a lens element.

Furthermore described is a method for installing and/or interchanging optical elements of an optical system. The method here has the following steps: a) inserting at least one optical element into the optical system by connecting it to a holding frame, b) measuring a position and/or spatial orientation of the at least one optical element relative to a sensor frame, wherein the sensor frame is arranged at least partially within the holding frame, c) positioning and/or spatially orienting the at least one optical element relative to the sensor frame in accordance with the measurement result from step b), and d) fixing the positioned and/or spatially oriented at least one optical element.

Due to the fact that the sensor frame is arranged at least partially within the holding frame, an optical element of the optical system can be installed or interchanged relatively easily.

In accordance with an embodiment of the method, the following step is performed before step a): removing at least one optical element from the optical system.

In accordance with an embodiment of the method, the measurement of the position and/or spatial orientation of the at least one optical element in step b) is performed in a contact-free manner. Due to the contact-free measurement, no forces are transferred to the optical element during the measurement.

In accordance with a further embodiment of the method, the measurement of the position and/or spatial orientation of the at least one optical element in step b) is performed using one or more optical sensors. Optical sensors are advantageously highly suitable for vacuum environments.

In accordance with a further embodiment of the method, a module is inserted in step a) into the optical system, which module includes the at least one optical element, a modular sensor frame and/or a modular holding frame, wherein the module is interchangeable. Advantageously, the entire module can be installed in and removed from the optical system.

The embodiments and features described for the proposed optical system are correspondingly applicable to the proposed method.

Furthermore proposed is a photomask inspection system for inspecting a photomask using an optical system, as described. The photomask can be inspected for errors using the photomask inspection system.

Furthermore proposed is a projection system for a lithography apparatus including an optical system, as described.

Furthermore, a lithography apparatus including a projection system, as described, or an optical system, as described, is proposed.

Further possible implementations of the disclosure also include not explicitly mentioned combinations of features or embodiments that are described above or below with respect to the exemplary embodiments. In this respect, a person skilled in the art will also add individual aspects to the respective basic form of the disclosure as improvements or additions.

Further advantageous configurations and aspects of the disclosure are the subject of the dependent claims and also of the exemplary embodiments of the disclosure described below.

BRIEF DESCRIPTION OF THE DRAWINGS

In the text that follows, the disclosure is explained in more detail on the basis of preferred embodiments with reference to the accompanying figures, in which.

DETAILED DESCRIPTION

Unless otherwise indicated, the same reference signs in the figures denote elements that are the same or functionally the same. It should also be noted that the illustrations in the figures are not necessarily to scale.

Figure 1:
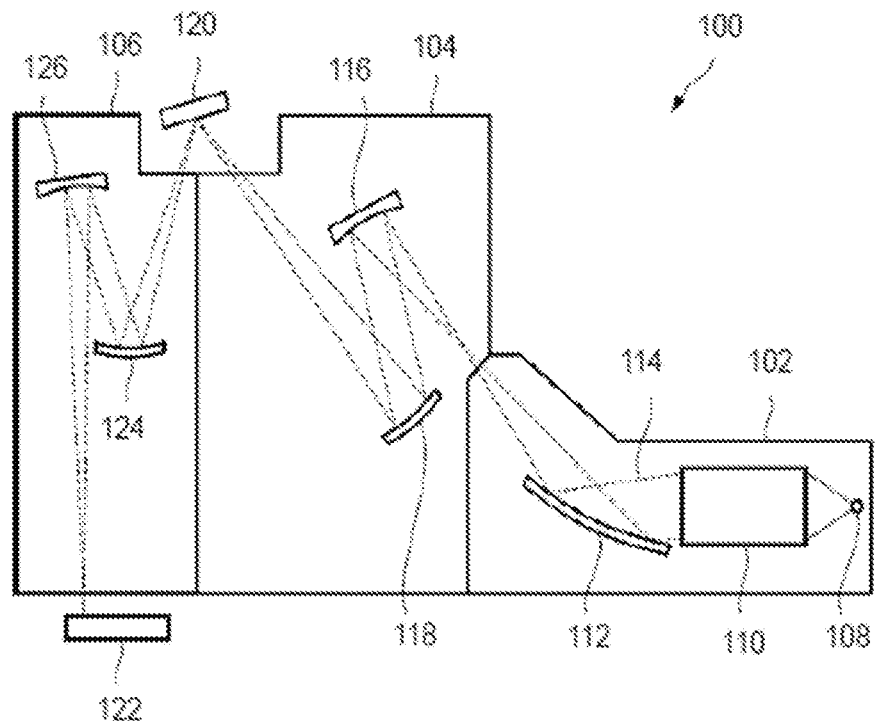
FIG. 1 shows a schematic view of an EUV lithography apparatus.

FIG. 1 shows a schematic view of an EUV lithography apparatus 100 according to one embodiment, which includes a beam shaping system 102, an illumination system 104 and a projection system 106. The beam shaping system 102, the illumination system 104 and the projection system 106 are respectively provided in a vacuum housing, which is evacuated with the aid of an evacuation device that is not depicted in any more detail. The vacuum housings are surrounded by a machine room (not depicted in any more detail), in which the drive apparatuses for mechanically moving or adjusting the optical elements are provided. Moreover, electrical controllers and the like can also be provided in this machine room.

The beam shaping system 102 has an EUV light source 108, a collimator 110 and a monochromator 112. A plasma source or a synchrotron, which emit radiation in the EUV range (extreme ultraviolet range), that is to say for example in the wavelength range from 0.1 nm to 30 nm, may for example be provided as the EUV light source 108. The radiation emitted by the EUV light source 108 is first focused by the collimator 110, after which the desired operating wavelength is filtered out by the monochromator 112. Consequently, the beam shaping system 102 adapts the wavelength and the spatial distribution of the light emitted by the EUV light source 108. The EUV radiation 114 generated by the EUV light source 108 has a relatively low transmissivity through air, for which reason the beam guiding spaces in the beam shaping system 102, in the illumination system 104 and in the projection system 106 are evacuated.

In the depicted example, the illumination system 104 includes a first mirror 116 and a second mirror 118. These mirrors 116, 118 may for example be formed as facet mirrors for pupil shaping and conduct the EUV radiation 114 to a photomask 120.

The photomask 120 is likewise formed as a reflective optical element and may be arranged outside the systems 102, 104, 106. The photomask 120 has a structure which is imaged onto a wafer 122 or the like in a reduced fashion via the projection system 106. For this purpose, the projection system 106 has in the beam guiding space for example a third mirror 124 and a fourth mirror 126. It should be noted that the number of mirrors of the EUV lithography apparatus 100 is not restricted to the number represented. A greater or lesser number of mirrors can also be provided. Furthermore, the mirrors, as a rule, are curved on their front side for beam shaping.

Figure 2:
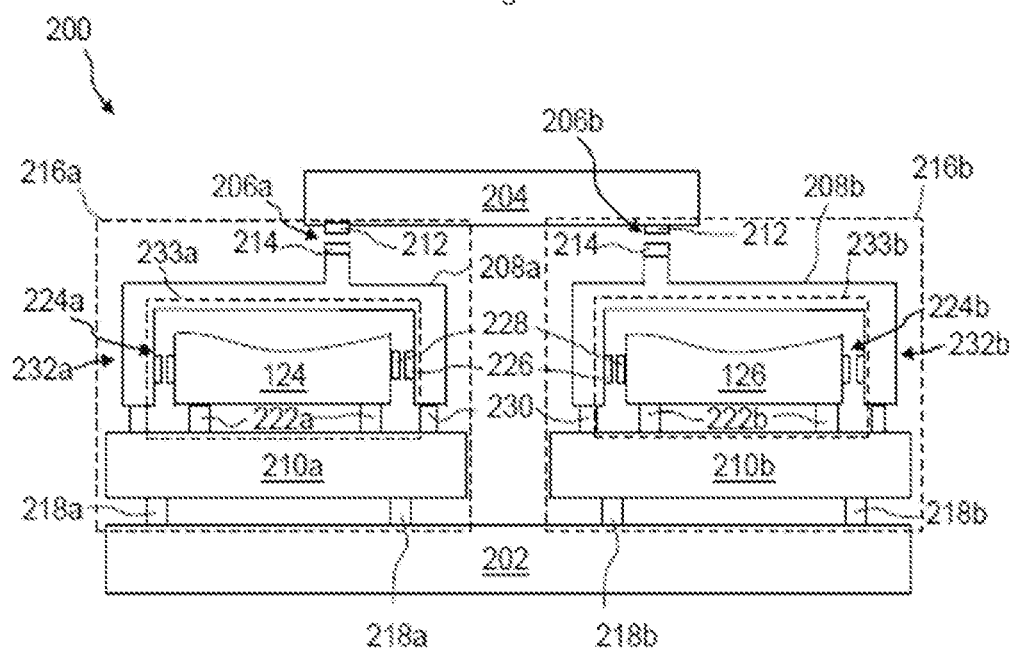
FIG. 2 shows a schematic view of an optical system in accordance with a first exemplary embodiment.

FIG. 2 shows a schematic view of an optical system 200 in accordance with a first exemplary embodiment. The optical system 200 is, for example, part of the EUV lithography apparatus 100 illustrated in FIG. 1 or, more specifically, part of the projection system 106 illustrated in FIG. 1. Alternatively, the optical system 200 can also be part of the illumination system 104 illustrated in FIG. 1.

The optical system 200 has a holding frame 202 (in the present case also "base holding frame"), a sensor frame 204 (in the present case also "base sensor frame") and, by way of example, optical elements in the form of the two mirrors 124, 126. The optical system 200 furthermore has two sensors 206a, 206b. A corresponding modular sensor frame 208a, 208b and a corresponding modular holding frame 210a, 210b are provided for each of the two mirrors 124, 126.

A sensor 206a, 206b has a transmitting and receiving unit 212 and a corresponding measurement object 214, which sends an optical signal back to the transmitting and receiving unit 212. The position and/or spatial orientation of one of the mirrors 124, 126 can be determined on the basis of the signal that is sent back. The transmitting and receiving unit 212 of the sensor 206a, 206b is preferably attached to the sensor frame 204. In this case, the measurement object 214, which sends the signal back to the transmitting and receiving unit 212, is arranged at the respective modular sensor frame 208a, 208b, which is associated with the corresponding mirror 124, 126. Alternatively, the measurement object 214 can also be attached to the sensor frame 204. The transmitting and receiving unit 212 is then attached to the modular sensor frame 208a, 208b, which is associated with the corresponding mirror 124, 126. At least part of a respective sensor 206a, 206b is accordingly attached to the sensor frame 204.

The optical system 200 has a module control loop 216a, 216b for each of the two mirrors 124, 126. Each of the module control loops 216a, 216b depicted in FIG. 2 includes actuators 218a, 218b and the sensors 206a, 206b. The module control loops 216a, 216b can be used to position and/or spatially orient the respective mirror 124, 126 together with the modular sensor frame 208a, 208b and the modular holding frame 210a, 210b relative to the sensor frame 204. The modular holding frames 210a, 210b are here connected to the holding frame 202 via the actuators 218a, 218b.

The optical system 200 depicted in FIG. 2 furthermore has an optical control loop 233a, 233b for each of the two mirrors 124, 126. Each of the two optical control loops 233a, 233b illustrated includes actuators 222a, 222b and sensors 224a, 224b. The optical control loops 233a, 233b can be used to position and/or spatially orient the respective mirror 124, 126 relative to the modular sensor frame 208a, 208b. The mirrors 124, 126 are here connected to the modular holding frame 210a, 210b via the second actuators 222a, 222b.

The sensor 224a, 224b has a transmitting and receiving unit 226 and a corresponding measurement object 228, which sends a signal back to the transmitting and receiving unit 226. The position and/or spatial orientation of one of the mirrors 124, 126 relative to the modular sensor frame 208a, 208b can be determined on the basis of the signal that is sent back. The transmitting and receiving unit 226 is preferably attached to the modular sensor frame 208a, 208b. In this case, the measurement object 228 is arranged at the mirror 124, 126. Alternatively, the arrangement can also be the other way around. At least part of the sensor 224a, 224b is accordingly attached to the modular sensor frame 208a, 208b.

One of the mirrors 124, 126, the corresponding modular sensor frame 208a, 208b and/or the corresponding modular holding frame 210a, 210b can in each case form a module 232a, 232b. The respective module 232a, 232b can be installed and removed from the optical system 200 as a component.

Alternatively, the optical system 200 does not have a modular holding frame 210a, 210b and/or a modular sensor frame 208a, 208b for each mirror 124, 126 (or for no mirror 124, 126). Positioning and/or spatial orientation of the mirrors 124, 126 is performed for the mirrors 124, 126 without associated modular holding frame 210a, 210b and modular sensor frame 208a, 208b only via the optical control loops 233a, 233b.

The mirrors 124, 126 are always capable of being positioned and spatially oriented in six degrees of freedom. This ability to be positioned and spatially oriented can be achieved by way of the module and/or optical control loop 216a, 216b, 233a, 233b. In the sum, the ability to be positioned and spatially oriented in six degrees of freedom, i.e. the ability to be positioned and spatially oriented in three spatial directions and at three angles, is always achieved by way of the control loops 216a, 216b, 233a, 233b.

The actuators 218a, 218b and the actuators 222a, 222b form a cascaded system. By way of example, the module control loop 216a, 216b can increase the actuation range of the mirror 124, 126 and thus ideally complement the optical control loop 233a, 233b, which is highly precise but in turn limited in the actuation range. This permits both coarse and fine adjustment.

The sensor frame 204 is arranged partially or completely within a volume V (see FIGS. 3 and 3a, wherein the latter depicts a section IIIa-IIIa from FIG. 3) which is enclosed by the holding frame 202. By way of example, the holding frame 202 can enclose an at least partially cylindrical, in particular circular-cylindrical volume V, as can be seen from FIGS. 3 and 3a together. As a result, a mirror 124, 126 of the optical system 200 can be easily installed or interchanged. This advantage is achieved because no closed sensor frame is present anymore which would surround the holding frame 202 and impede the introduction of a mirror 124, 126 into the optical system 200 or removal of a mirror 124, 126 from the optical system 200. The sensor frame 204 can furthermore be arranged between the mirrors 124, 126. It is possible in this way for the sensor frame 204 to be guided into the vicinity of each mirror 124, 126 or of each modular sensor frame 208, which is associated with a mirror 124, 126. As a result, the mirrors 124, 126 can be positioned and spatially oriented on the basis of the sensor frame 204.

The respective modular sensor frame 208a, 208b can be connected to the respective modular holding frame 210a, 210b via in particular oscillation-decoupling connecting elements 230 (see FIG. 2). The sensors 206a, 206b, 224a, 224b can be in the form of optical sensors. The optical system 200 can also have lens elements or other optical elements instead of or in addition to the mirrors 124, 126.

Figure 3:
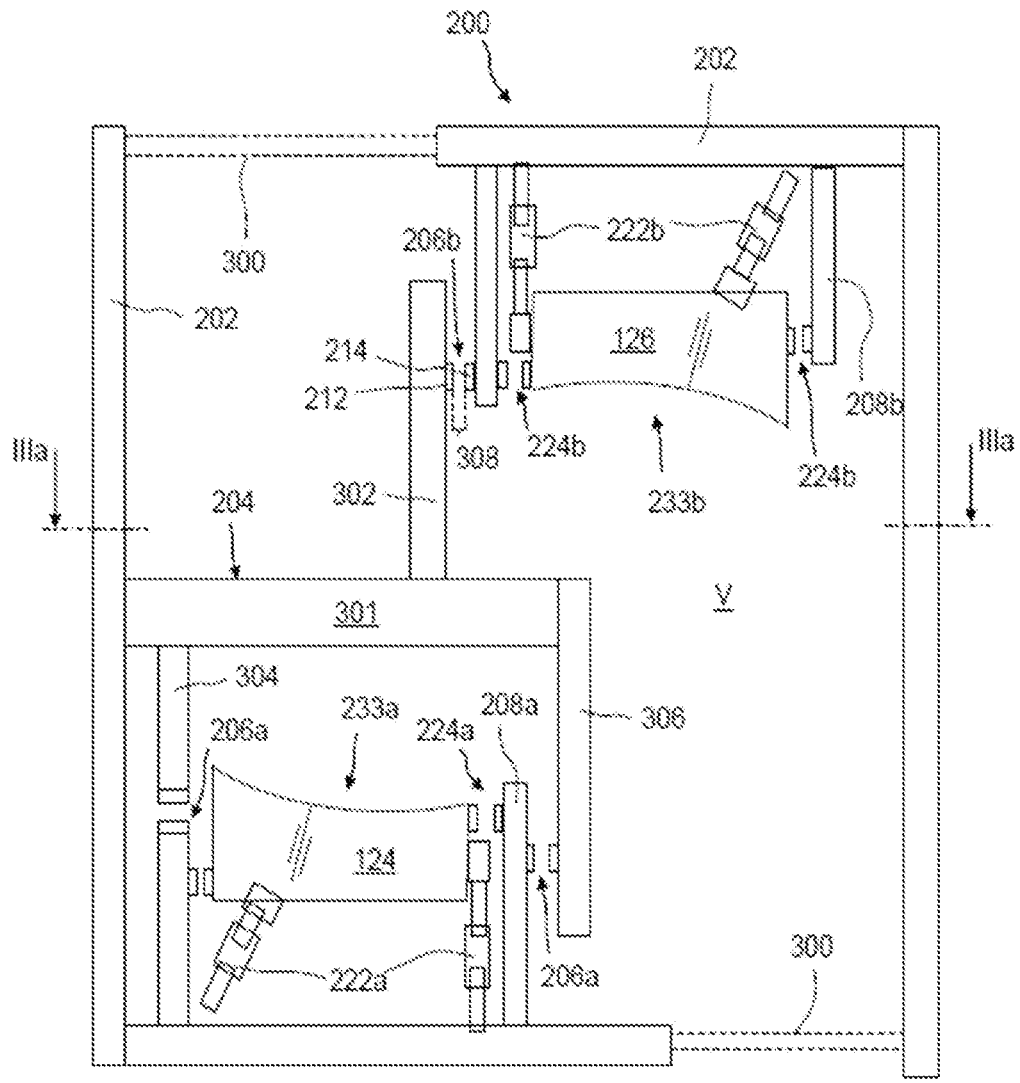
FIG. 3 shows a schematic view of an optical system in accordance with a second exemplary embodiment.
Figure 3A:
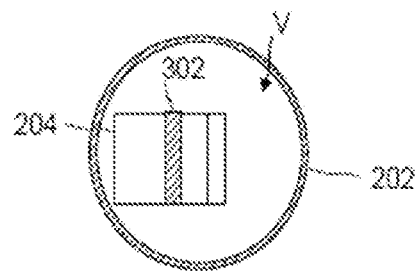
FIG. 3A shows a section IIIa-IIIa from FIG. 3.

FIG. 3 shows a schematic view of an optical system 200 in accordance with a second exemplary embodiment. In this exemplary embodiment, the sensor frame 204 is arranged entirely within the holding frame 202. The EUV radiation in the holding frame 202 passes via holes 300 to the mirrors 124, 126 and out of the holding frame 202. As opposed to the exemplary embodiment from FIG. 2, the exemplary embodiment of FIG. 3 has no modular holding frames 210a, 210b for the mirrors 124, 126. FIG. 3 does not depict cascaded actuators either. It does show the actuators 222a, 222b for the optical control loop 233a, 233b. It would alternatively also be possible to provide the actuators 218a, 218b for the module control loop 216a, 216b. The mirror 124, 126 can thus be positioned and/or spatially oriented relative to the sensor frame 204 and/or relative to the respective modular sensor frame 208a, 208b.

The sensor frame 204 has a base body 301 and, projecting therefrom, a first arm 302, a second arm 304, and a third arm 306. Consequently, the sensors 206a, 206b can be arranged near the modular sensor frames 208a, 208b. Alternatively, the sensor frame can also be configured in the form of a scaffold. In a further alternative, a plurality of arms of the sensor frame 204 can form a star shape. The arms 302, 304, 306 and the base body 301 are configured in one part or in one piece.

The measurement distance, or the measurement section, 308 is the distance between the transmitting and receiving unit 212 and the measurement body 214 and is less than 8 mm, preferably less than 4 mm and with further preference less than 1 mm. A small measurement distance 308 permits very accurate measurement of the position and/or of the spatial orientation of the modular sensor frame 208 and thus of the mirror 124, 126. The small measurement distance 308 is achieved by way of the arms 302, 304, 306 having the sensors 206a, 206b and reaching to the modular sensor frames 208a, 208b.

The sensor frame 204 shown in FIG. 3 is attached to the holding frame 202, possibly via a mechanical insulation (flexible connection) (not illustrated). Attachment can be effected by way of an interface ring (not shown).

Figure 4:
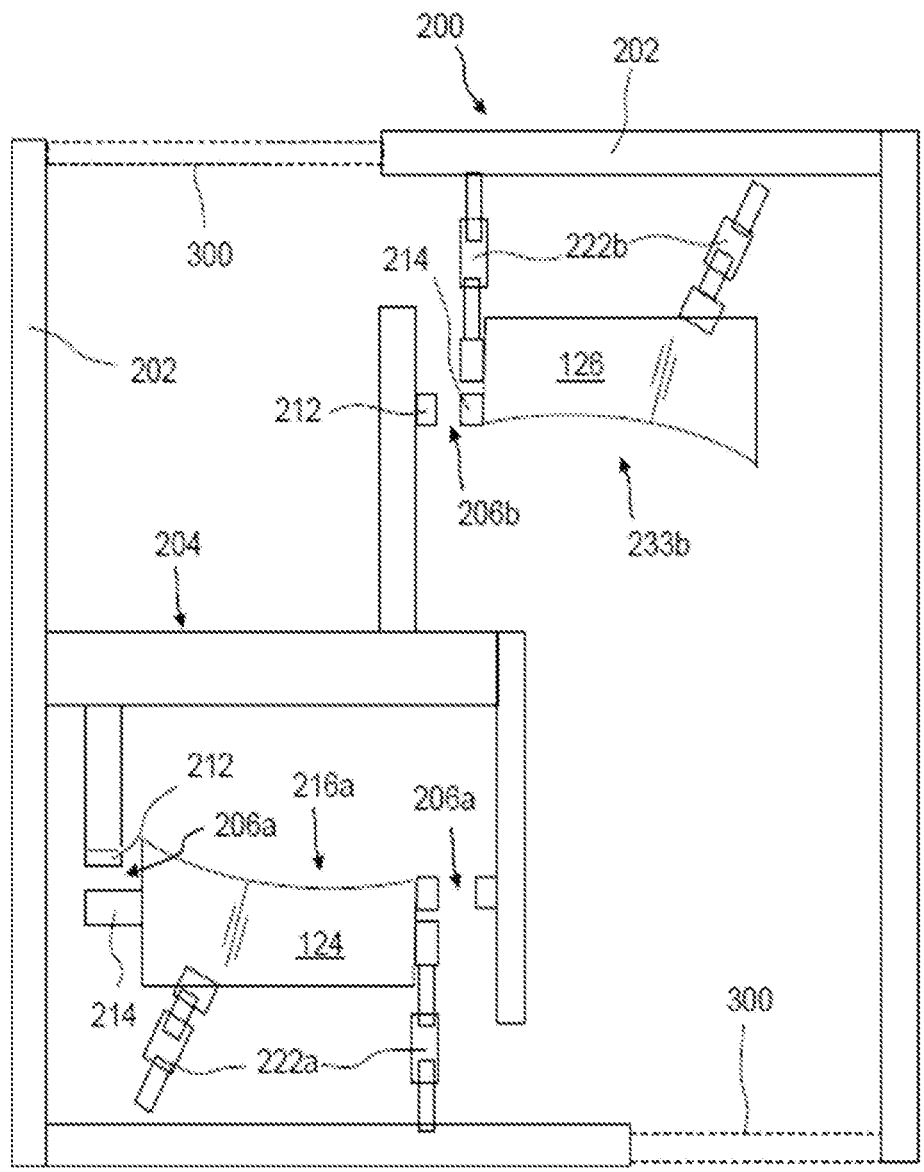
FIG. 4 shows a schematic view of an optical system in accordance with a third exemplary embodiment.

FIG. 4 shows a schematic view of an optical system 200 in accordance with a third exemplary embodiment. The third exemplary embodiment differs from the second exemplary embodiment in that no modular sensor frame 208a, 208b is associated with the mirrors 124, 126. An optical control loop 233a, 233b can be used to position and/or spatially orient a mirror 124, 126 relative to the sensor frame 204. Here, the optical control loop 233a, 233b has actuators 222a, 222b and sensors 206a, 206b.

Figure 5:
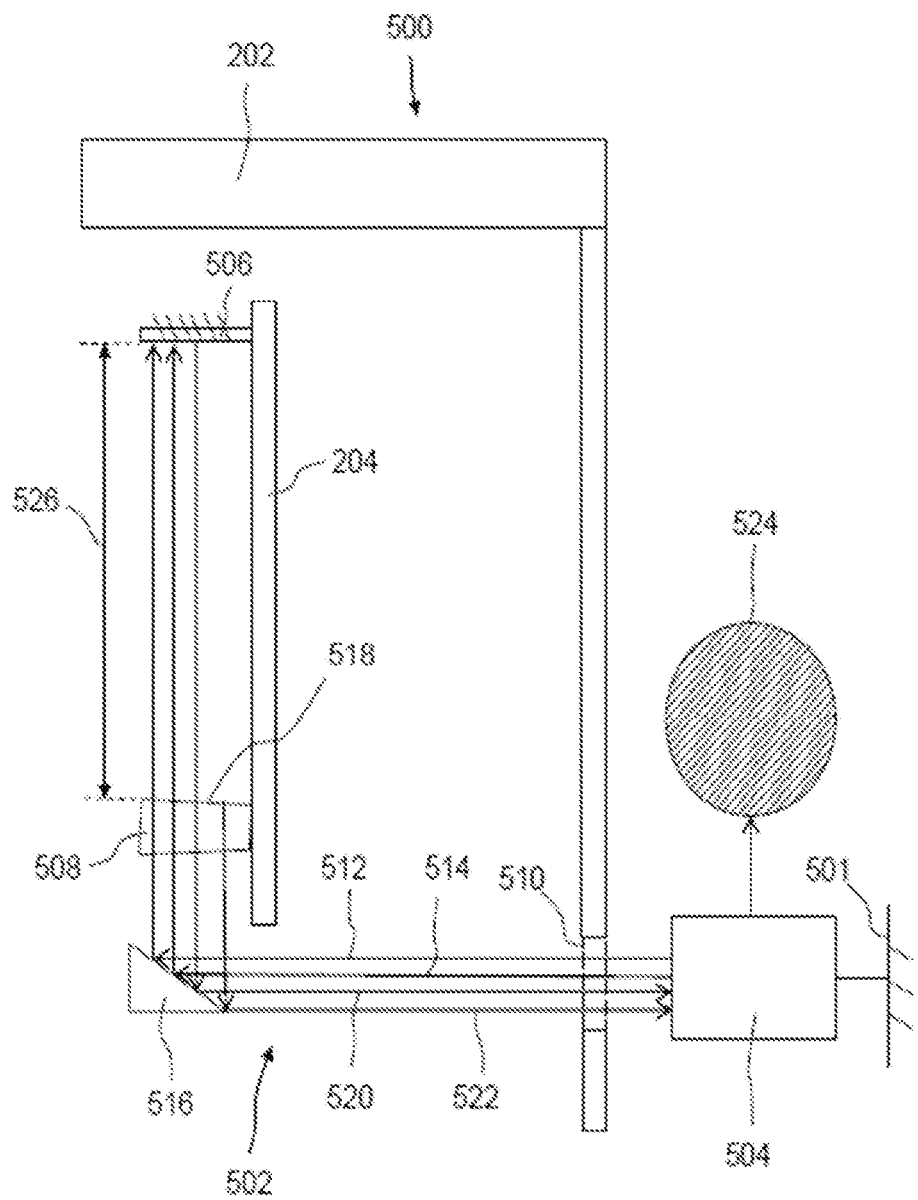
FIG. 5 shows a schematic view of a part of an optical system in accordance with a fourth exemplary embodiment.

FIG. 5 shows a schematic view of a part 500 of an optical system 200 in accordance with a fourth exemplary embodiment. Mirrors 124, 126 are not shown. Illustrated are the holding frame 202 and the sensor frame 204. The sensor frame 204 is measured using a phase-shifting interferometer 502. The phase-shifting interferometer 502 has an interferometer component 504, which is positioned in a defined manner with respect to a reference 501 outside the holding frame 202, a measurement mirror 506 and an optical component 508. The interferometer component 504 is arranged outside the holding frame 202. Electromagnetic radiation, illustrated by way of a first ray 512 and a second ray 514, is directed through an opening 510 via a deflection mirror 516 onto the measurement mirror 506. In the process, the first ray 512 and the second ray 514 pass through the optical component 508.

The measurement mirror 506 and the optical component 508 are fixedly connected to the sensor frame 204. The optical component 508 has, on its side facing the measurement mirror 506, a reference surface 518. The reference surface 518 is inclined relative to the measurement mirror 506. The radiation reflected at the measurement mirror 506, illustrated by way of a third ray 520 and a fourth ray 522, is directed via the deflection mirror 516 and through the opening 510 back into the interferometer component 504. In the process, the radiation passes for a second time through the optical component 508. Owing to the reference surface 518 being inclined relative to the measurement mirror 506, the third and fourth rays 520, 522 have different optical paths and phases. As a consequence, an interferogram 524 can be seen in the interferometer component 504. The different optical paths and phases of the third and fourth rays 520, 522 are symbolized by way of the returning fourth ray 522 starting only at the reference surface 518.

A measurement section 526 is located between the measurement mirror 506 and the optical component 508. If the length of the sensor frame 204 changes, the length of the measurement section 526 will also change. This change in length can be read in the interferogram 524.

Figure 6:
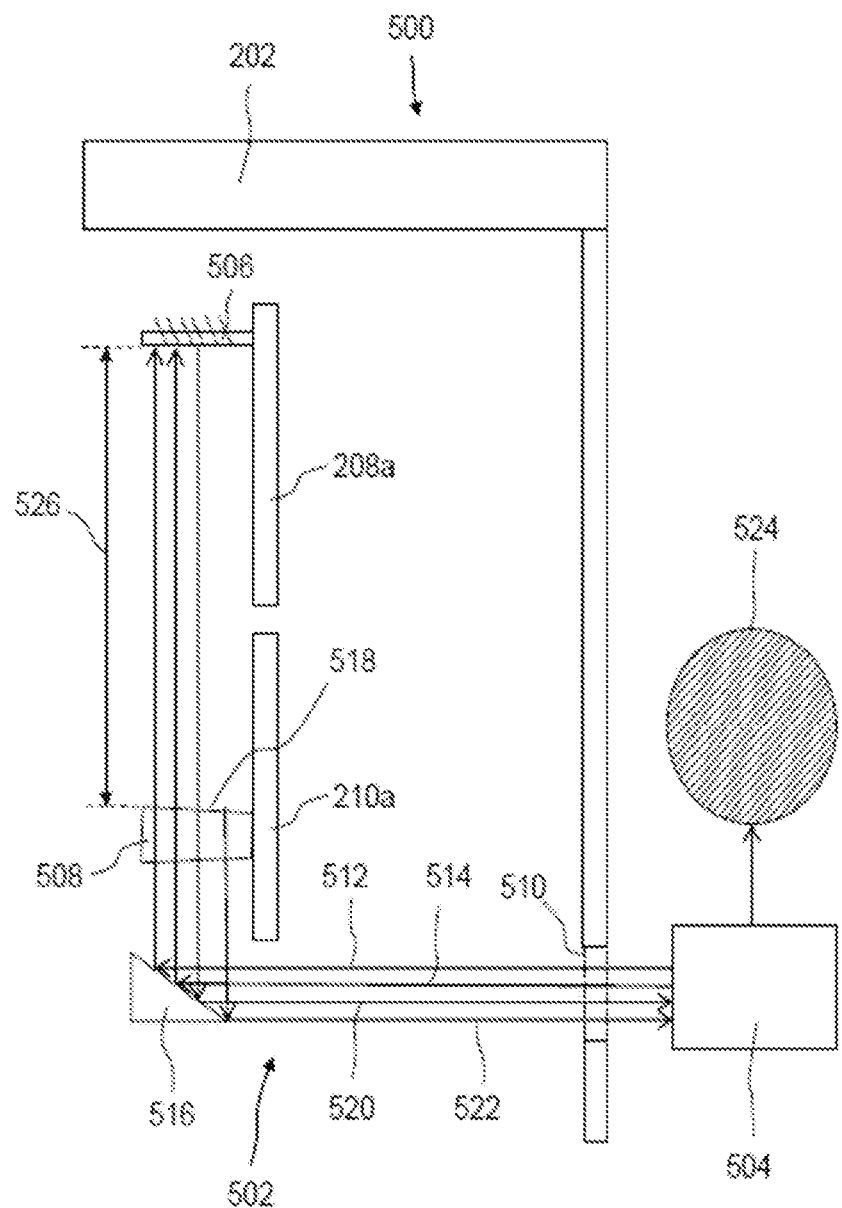
FIG. 6 shows a schematic view of a part of an optical system in accordance with a fifth exemplary embodiment.

FIG. 6 shows a schematic view of a part 500 of an optical system 200 in accordance with a fifth exemplary embodiment. As opposed to the fourth exemplary embodiment shown in FIG. 5, the fifth exemplary embodiment shows the modular sensor frame 208a and the modular holding frame 210a. If the position of the modular sensor frame 208a and/or the position of the modular holding frame 210a changes, the length of the measurement section 526 will also change. This change in length can be read in the interferogram 524.

Figure 7:
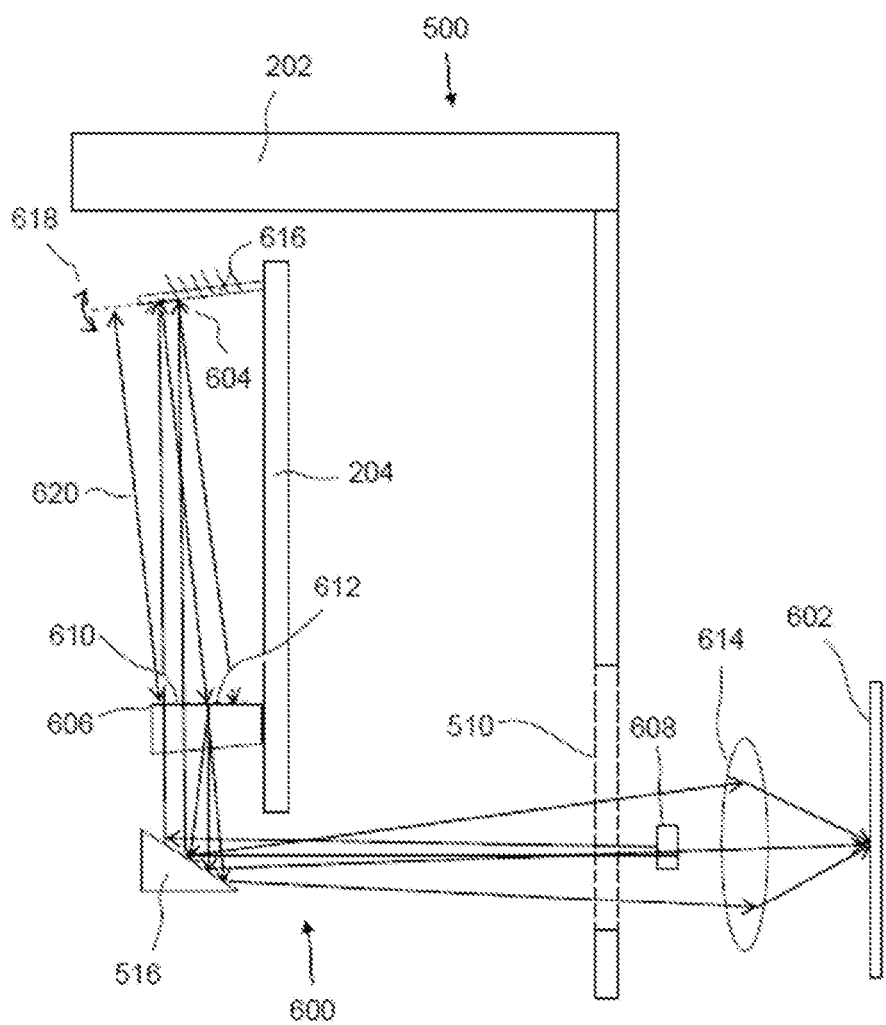
FIG. 7 shows a schematic view of a part of an optical system in accordance with a sixth exemplary embodiment.

FIG. 7 shows a schematic view of a part 500 of an optical system 200 in accordance with a sixth exemplary embodiment. Mirrors 124, 126 are not shown. Illustrated are the holding frame 202 and the sensor frame 204. The sensor frame 204 is measured using an interferometer 600 with moiré measurement technology. The interferometer 600 with moiré measurement technology has a camera 602, a concave mirror 604 and a grating 606. The camera 602 is arranged outside the holding frame 202. A light source 608 is likewise arranged outside the holding frame 202. Electromagnetic radiation from the light source 608 is directed through an opening 510, via a deflection mirror 516, onto the left-hand part 610 of the grating 606. The left-hand part 610 of the grating 606 is imaged, by way of the concave mirror 604, onto the right-hand part 612 of the grating 606. This gives a moiré pattern, which is recorded, via the deflection mirror 516 and an observation optical unit 614, by the camera 602.

The concave mirror 604 is fixedly connected to the sensor frame 204 using a connecting element 616. The grating 606 is likewise fixedly connected to the sensor frame 204. If the sensor frame 204 bends, the concave mirror 604 will be tilted. This is symbolized by way of the curved double-headed arrow 618. As a result, the moiré measurement section 620 is lengthened or shortened, and the image of the left-hand part 610 of the grating 606 will be shifted to the right-hand part 612 of the grating 606. This effects a change in the moiré pattern, which is detected by way of the camera 602.

Figure 8:
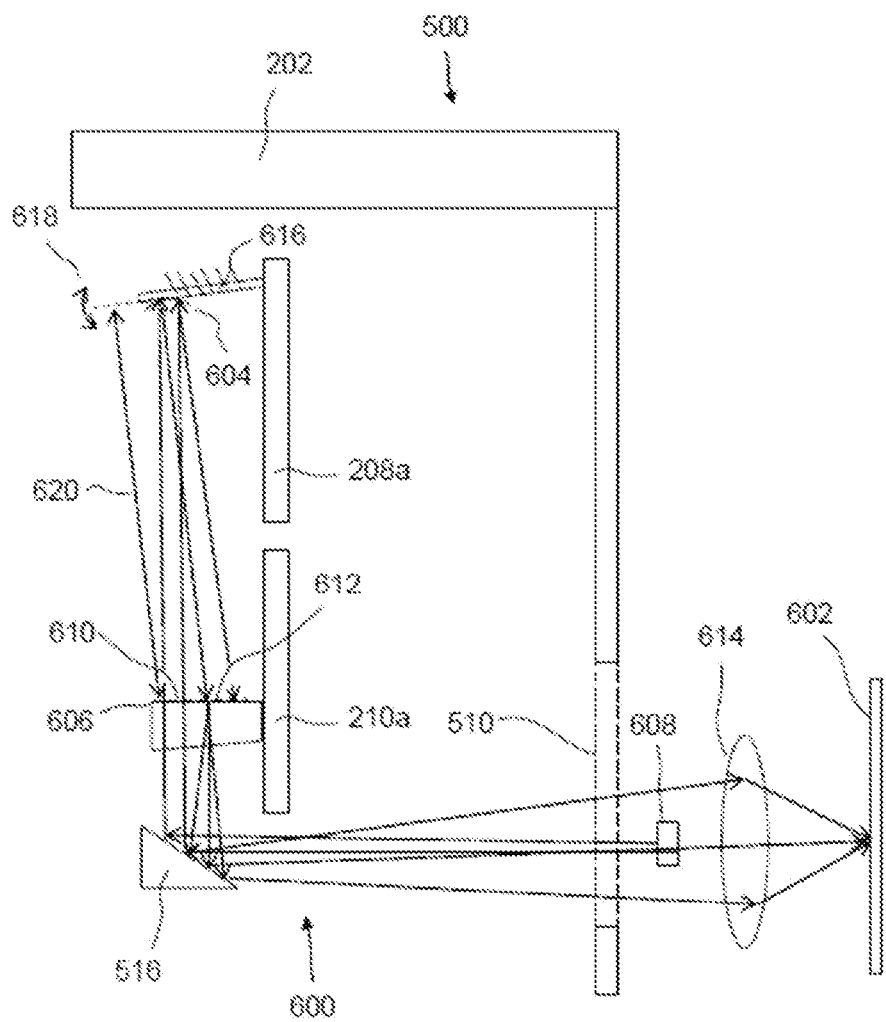
FIG. 8 shows a schematic view of a part of an optical system in accordance with a seventh exemplary embodiment.

FIG. 8 shows a schematic view of a part 500 of an optical system 200 in accordance with a seventh exemplary embodiment. As opposed to the sixth exemplary embodiment shown in FIG. 7, the seventh exemplary embodiment shows the modular sensor frame 208a and the modular holding frame 210a. If the position and/or the spatial orientation of the modular sensor frame 208a and/or the position and/or the spatial orientation of the modular holding frame 210a changes, then the length of the moiré measurement section 620 will also change and the image of the left-hand part 610 of the grating 606 will be shifted onto the right-hand part 612 of the grating 606. This effects a change in the moiré pattern, which is detected by way of the camera 602.

Figure 9:
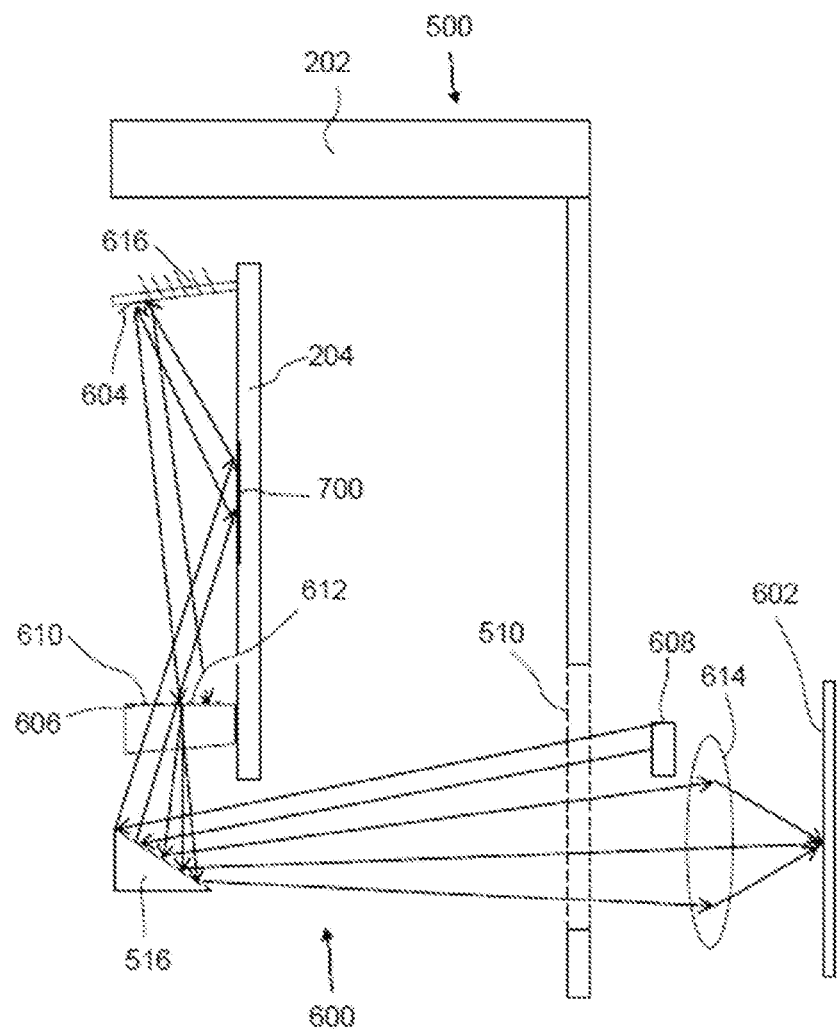
FIG. 9 shows a schematic view of a part of an optical system in accordance with an eighth exemplary embodiment.

FIG. 9 shows a schematic view of a part 500 of an optical system 200 in accordance with an eighth exemplary embodiment. The eighth exemplary embodiment differs from the sixth exemplary embodiment in FIG. 7 in that a plane mirror 700 is provided on the sensor frame 204 in the eighth exemplary embodiment. In the eighth exemplary embodiment, once again a left-hand part 610 of a grating 606 is imaged onto a right-hand part 612 of the grating 606, and the resulting moiré pattern is detected. However, the radiation is deflected via the plane mirror 700. Hereby, a twisting measurement section is produced using the moiré measurement technique. The main idea is here that the obliquely illuminated plane mirror 700 rotates the image of the left-hand part 610 of the grating 606 if it is tilted about an axis located in the plane of incidence.

Figure 10:
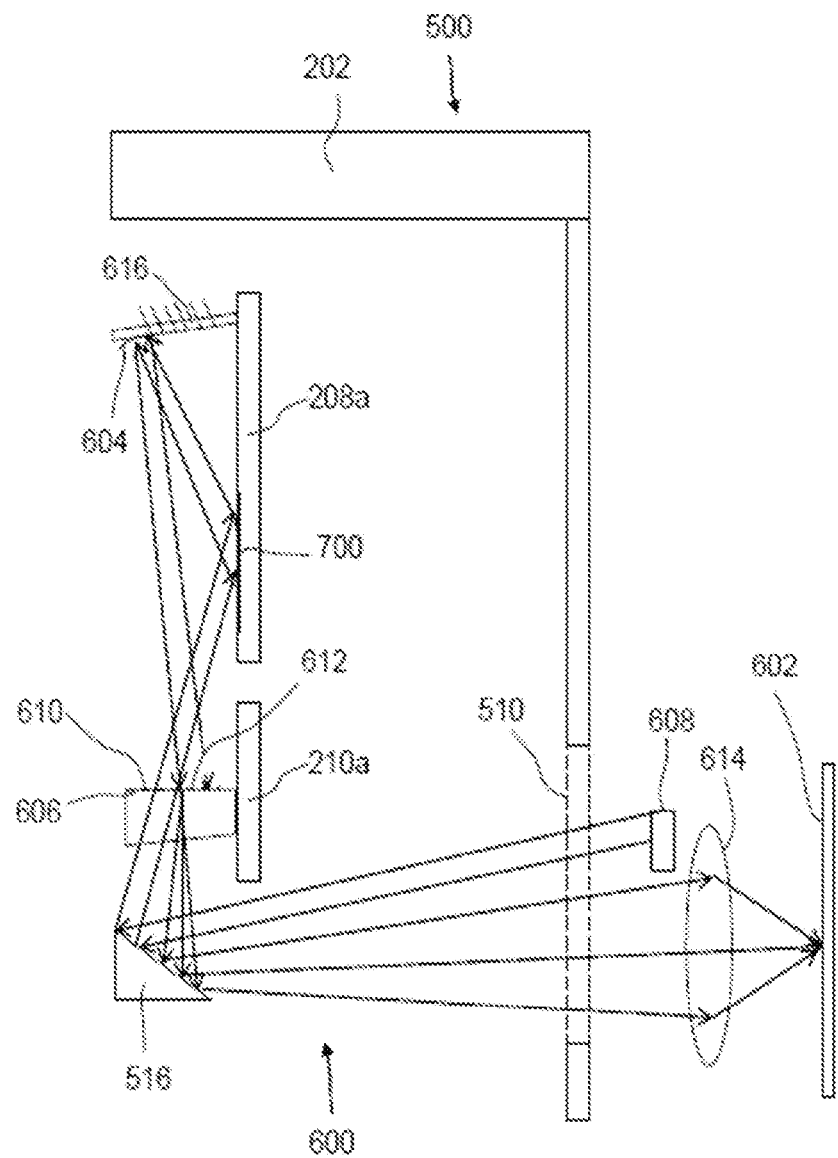
FIG. 10 shows a schematic view of a part of an optical system in accordance with a ninth exemplary embodiment.

FIG. 10 shows a schematic view of a part 500 of an optical system 200 in accordance with a ninth exemplary embodiment. As opposed to the eighth exemplary embodiment shown in FIG. 9, the ninth exemplary embodiment shows the modular sensor frame 208a and the modular holding frame 210a. The plane mirror 700 is here arranged on the modular sensor frame 208a. If the position and/or the spatial orientation of the modular sensor frame 208a and/or the position and/or the spatial orientation of the modular holding frame 210a changes, the moiré pattern will also change.

Figure 11:
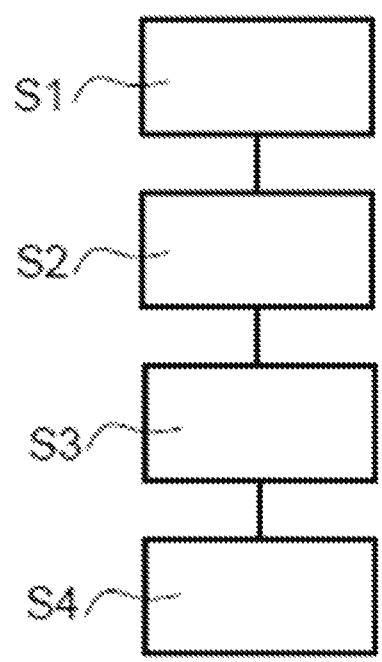
FIG. 11 shows a flowchart of a method for installing and/or interchanging mirrors of an optical system.

FIG. 11 shows a flowchart of a method for installing and/or interchanging mirrors 124, 126 of an optical system 200. In a first step S1, one of the mirrors 124, 126 is inserted into the optical system 200. In a second step S2, the position and/or spatial orientation of the mirror 124, 126 relative to a sensor frame 204 is measured. The sensor frame 204 is here arranged at least partially within a holding frame 202. In a third step S3, the mirror 124, 126 is positioned and/or spatially oriented relative to the sensor frame 204 in accordance with the measurement result according to step 2. In a fourth step S4, the positioned and/or spatially oriented mirror 124, 126 is secured.

The measurement of the position and/or spatial orientation of the mirror 124, 126 in step S2 can be effected in a contact-free manner. Furthermore, the measurement of the position and/or spatial orientation of the mirror 124, 126 in step S2 can be effected using one or more optical sensors 206a, 206b, 224a, 224b.

Exemplary embodiments for an optical system 200 of an EUV lithography apparatus with a wavelength of the operating light of between 0.1 and 30 nm have been explained. However, the disclosure is not restricted to EUV lithography apparatuses and may also be applied to other lithography apparatuses. A DUV (deep ultraviolet) lithography apparatus having a wavelength of the operating light of between 30 and 250 nm is mentioned here by way of example. The optical system 200 can furthermore also be used in a photomask inspection system for inspecting a photomask 120.

Although the disclosure has been described on the basis of various exemplary embodiments, it is not in any way restricted to them but rather can be modified in a wide variety of ways.

LIST OF REFERENCE SIGNS

100 EUV lithography apparatus
102 Beam shaping system
104 Illumination system
106 Projection system
108 EUV light source
110 Collimator
112 Monochromator
114 EUV radiation
116 First mirror
118 Second mirror
120 Photomask
122 Wafer
124 Third mirror
126 Fourth mirror
200 Optical system
202 Holding frame 204 Sensor frame
206a, 206b Sensor
208a, 208b Modular sensor frame
210a, 210b Modular holding frame
212 Transmitting and receiving unit
214 Measurement object
216a, 216b Module control loop
218a, 218b Actuator
222a, 222b Actuator
224a, 224b Sensor
226 Transmitting and receiving unit
228 Measurement object
230 Connecting element
232a, 232b Module
233a, 233b Optical control loop
300 Hole
301 Base body
302 First arm
304 Second arm
306 Third arm
308 Measurement distance
500 Part
501 Reference
502 Phase-shifting interferometer
504 Interferometer component
506 Measurement mirror
508 Optical component
510 Opening
512 First ray
514 Second ray
516 Deflection mirror
518 Reference surface
520 Third ray
522 Fourth ray
524 Interferogram
526 Measurement section
600 Interferometer with moiré measurement technology
602 Camera
604 Concave mirror
606 Grating
608 Light source
610 Part of the grating
612 Part of the grating
614 Observation optical unit
616 Connecting element
618 Curved double-headed arrow
620 Moiré measurement section
700 Plane mirror
V Volume

What is claimed is:

1. An optical system, comprising:
a first module, comprising:
  a first mirror;
  a first modular sensor frame;
  a first sensor configured to capture a position and/or a spatial orientation of the first mirror relative to the first modular sensor frame; and
  a first actuator configured to position and/or orient the first mirror;
a second module, comprising:
  a second mirror;
  a second modular sensor frame;
  a second sensor configured to capture a position and/or a spatial orientation of the second mirror relative to the second modular sensor frame; and
  a second actuator configured to position and/or orient the second mirror;
a force frame connected to the first and second modules so that the first and second modules are removable from the optical system;
a sensor frame decoupled from the force frame;
a third sensor configured to capture a position and/or spatial orientation of the first modular sensor frame relative to the sensor frame;
a fourth sensor configured to capture a position and/or spatial orientation of the second modular sensor frame relative to the sensor frame;
a first optical control loop configured to regulate a position and/or a spatial orientation of the first mirror relative to the first modular sensor frame; and
a second optical control loop configured to regulate a position and/or a spatial orientation of the second mirror relative to the second modular sensor frame,
wherein:
  the force frame encloses a volume; and
  the sensor frame is at least partially arranged within the volume.

2. The optical system of claim 1, wherein the first module comprises a first holding frame, and the force frame is connected to the first holding frame so that the first module is removable from the optical system.

3. The optical system of claim 1, wherein the second module comprises a second holding frame, and the force frame is connected to the second holding frame so that the second module is removable from the optical system.

4. The optical system of claim 1, wherein:
the first actuator is configured to position and/or orient the first mirror based on the position and/or spatial orientation of the first mirror captured by the first sensor; and
the second actuator is configured to position and/or orient the second mirror based on the position and/or spatial orientation of the second mirror captured by the second sensor.

5. The optical system of claim 1, wherein the first actuator is configured to position and/or orient the first mirror based on the position and/or spatial orientation of the first mirror captured by the first sensor.

6. The optical system of claim 5, wherein:
the first sensor comprises a unit;
the first mirror supports a measurement object;
the unit is configured to transmit a first signal to the measurement object so that a second signal is sent from the measurement object to the unit to determine the position and/or spatial orientation of the first mirror.

7. The optical system of claim 6, wherein the first signal is the same as the second signal.

8. The optical system of claim 7, wherein the unit comprises an interferometer configured to generate the first signal.

9. The optical system of claim 1, wherein:
the first sensor comprises a unit;
the first mirror supports a measurement object;
the unit is configured to transmit a first signal to the measurement object so that a second signal is sent from the measurement object to the unit to determine the position and/or spatial orientation of the first mirror.

10. The optical system of claim 9, wherein the first signal is the same as the second signal.

11. The optical system of claim 10, wherein the unit comprises an interferometer configured to generate the first signal.

12. The optical system of claim 1, further comprising a device configured to capture a change in position, a change in spatial orientation, and/or a deformation of the sensor frame or parts thereof with respect to a reference outside the sensor frame.

13. The optical system of claim 12, wherein the device comprises an interferometer.

14. The optical system of claim 1, wherein the system comprises a lithography projection system.

15. The optical system of claim 1, wherein the sensor frame is mechanically decoupled from the force frame.

16. An inspection system, comprising:
   an optical system according to claim 1,
   wherein the inspection system is configured to inspect a photomask.

17. A projection system, comprising:
   an optical system according to claim 1,
   wherein the projection system is a lithography projection system.

18. An apparatus, comprising:
   an optical system according to claim 1,
   wherein the apparatus is a lithography apparatus.

19. An apparatus, comprising:
   an illumination system; and
   a projection system comprising an optical system according to claim 1,
   wherein the apparatus is a lithography apparatus.

20. The apparatus of claim 19, wherein the apparatus is an EUV lithography apparatus.

21. A method of using a lithography apparatus comprising an illumination system and a projection system, the method comprising:
   using the illumination system to illuminate a structure of a photomask; and
   using het projection system to project image the structure onto a light-sensitive material,
   wherein the projection system comprises an optical system according to claim 1.

* * * * *

UNITED STATES PATENT AND TRADEMARK OFFICE
CERTIFICATE OF CORRECTION

| | | |
|---|---|---|
| PATENT NO. | : 12,346,033 B2 | Page 1 of 1 |
| APPLICATION NO. | : 17/718868 | |
| DATED | : July 1, 2025 | |
| INVENTOR(S) | : Rolf Freimann et al. | |

It is certified that error appears in the above-identified patent and that said Letters Patent is hereby corrected as shown below:

On the Title Page

Page 2, Column 2 (Other Publications), Line 2, delete "App" and insert -- Appl --.

In the Specification

Column 1, Line 11, delete "USC 120, to" and insert -- 35 USC 120 to --.

Column 1, Line 49, after "between" delete "in".

Column 5, Line 2, after "applies" insert -- to --.

Column 5, Line 49, delete "on" and insert -- one --.

In the Claims

Column 20, Line 15, in Claim 21, delete "het" and insert -- the --.

Signed and Sealed this
Twelfth Day of August, 2025

Coke Morgan Stewart
*Acting Director of the United States Patent and Trademark Office*